United States Patent
Tanaka et al.

(10) Patent No.: US 10,950,295 B2
(45) Date of Patent: Mar. 16, 2021

(54) MEMORY CELL ARRAY HAVING THREE-DIMENSIONAL STRUCTURE

(71) Applicant: TOSHIBA MEMORY CORPORATION, Tokyo (JP)

(72) Inventors: Chika Tanaka, Kanagawa (JP); Keiji Ikeda, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/567,919

(22) Filed: Sep. 11, 2019

(65) Prior Publication Data
US 2020/0302993 A1 Sep. 24, 2020

(30) Foreign Application Priority Data

Mar. 22, 2019 (JP) .............................. JP2019-054481

(51) Int. Cl.
| G11C 11/4097 | (2006.01) |
| G11C 11/4076 | (2006.01) |
| G11C 11/4099 | (2006.01) |
| G11C 11/404 | (2006.01) |
| G11C 11/4091 | (2006.01) |

(52) U.S. Cl.
CPC ........ G11C 11/4097 (2013.01); G11C 11/404 (2013.01); G11C 11/4076 (2013.01); G11C 11/4091 (2013.01); G11C 11/4099 (2013.01)

(58) Field of Classification Search
CPC ............ G11C 11/4097; G11C 11/4076; G11C 11/4099; G11C 11/404; G11C 11/4091
See application file for complete search history.

(56) References Cited

U.S. PATENT DOCUMENTS

| 8,213,226 B2* | 7/2012 | Carman ................ H01L 27/108 |
| | | 365/177 |
| 9,514,792 B2 | 12/2016 | Kajigaya |
| 9,698,272 B1* | 7/2017 | Ikeda .................. G11C 11/4097 |
| 2017/0117283 A1 | 4/2017 | Matsuzaki et al. |
| 2018/0033478 A1* | 2/2018 | Tanaka ................ G11C 11/4074 |

(Continued)

FOREIGN PATENT DOCUMENTS

| JP | 2001-023377 A | 1/2001 |
| JP | 2018-018568 A | 2/2018 |

OTHER PUBLICATIONS

Gillingham et al., "A Sense of Restore Technique for Multilevel DRAM," IEEE Transactions of Circuits an Systems II, Analog and Digital Signal Processing, vol. 43, No. 7, pp. 483-486 (Jul. 1996).

(Continued)

*Primary Examiner* — Mushfique Siddique
(74) *Attorney, Agent, or Firm* — Foley & Lardner LLP

(57) ABSTRACT

According to one embodiment, a semiconductor memory includes a first bit line; a second bit line; a source line; a first memory cell electrically connected between the first bit line and the source line and including a first transistor and a first capacitor; a second memory cell electrically connected between the second bit line and the source line and including a second transistor and a second capacitor; a third transistor electrically connected to the source line; and a sense amplifier circuit including a first node electrically connected to the first bit line and a second node electrically connected to the second bit line.

16 Claims, 8 Drawing Sheets

(56) References Cited

U.S. PATENT DOCUMENTS

| | | | |
|---|---|---|---|
| 2018/0082733 A1* | 3/2018 | Tanaka | G11C 11/4091 |
| 2018/0269210 A1* | 9/2018 | Tezuka | H01L 27/1225 |
| 2019/0295626 A1* | 9/2019 | Ikeda | G11C 11/4094 |

OTHER PUBLICATIONS

Okuda et al., "A Four-Level Storage 4-Gb DRAM," IEEE Journal of Solid-State Circuits, vol. 32, No. 11, pp. 1743-1747, (Nov. 1997).

* cited by examiner

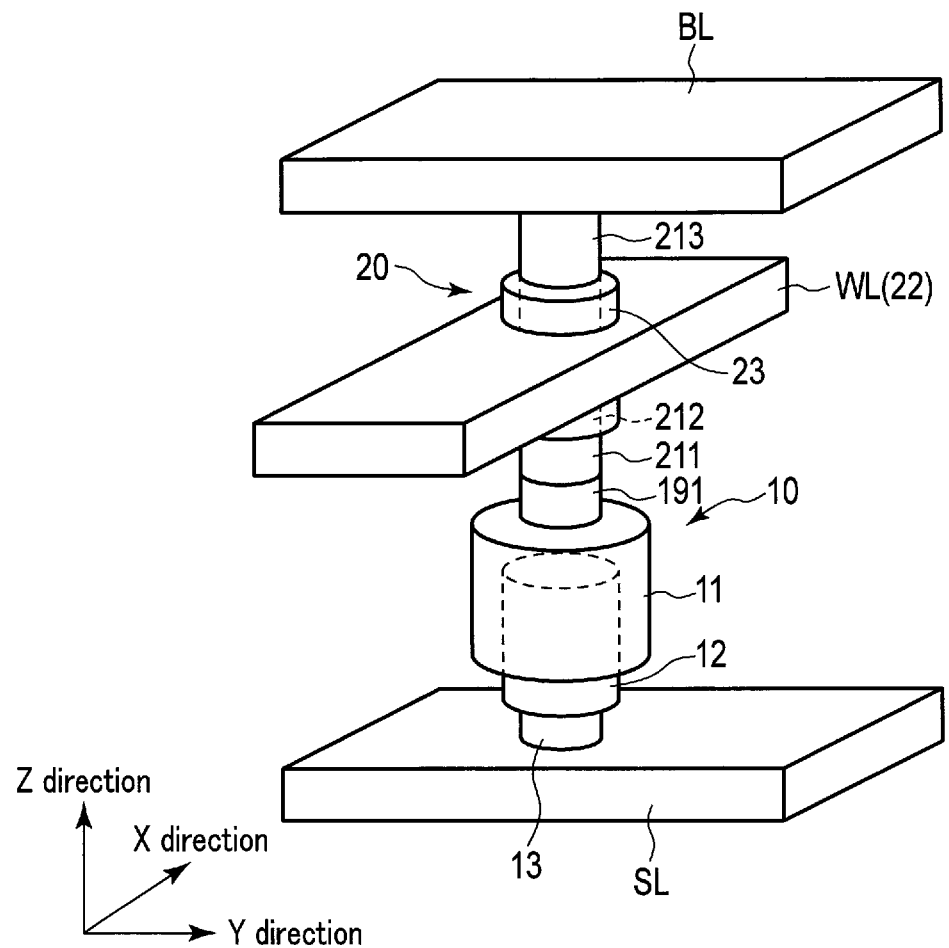
F I G. 4

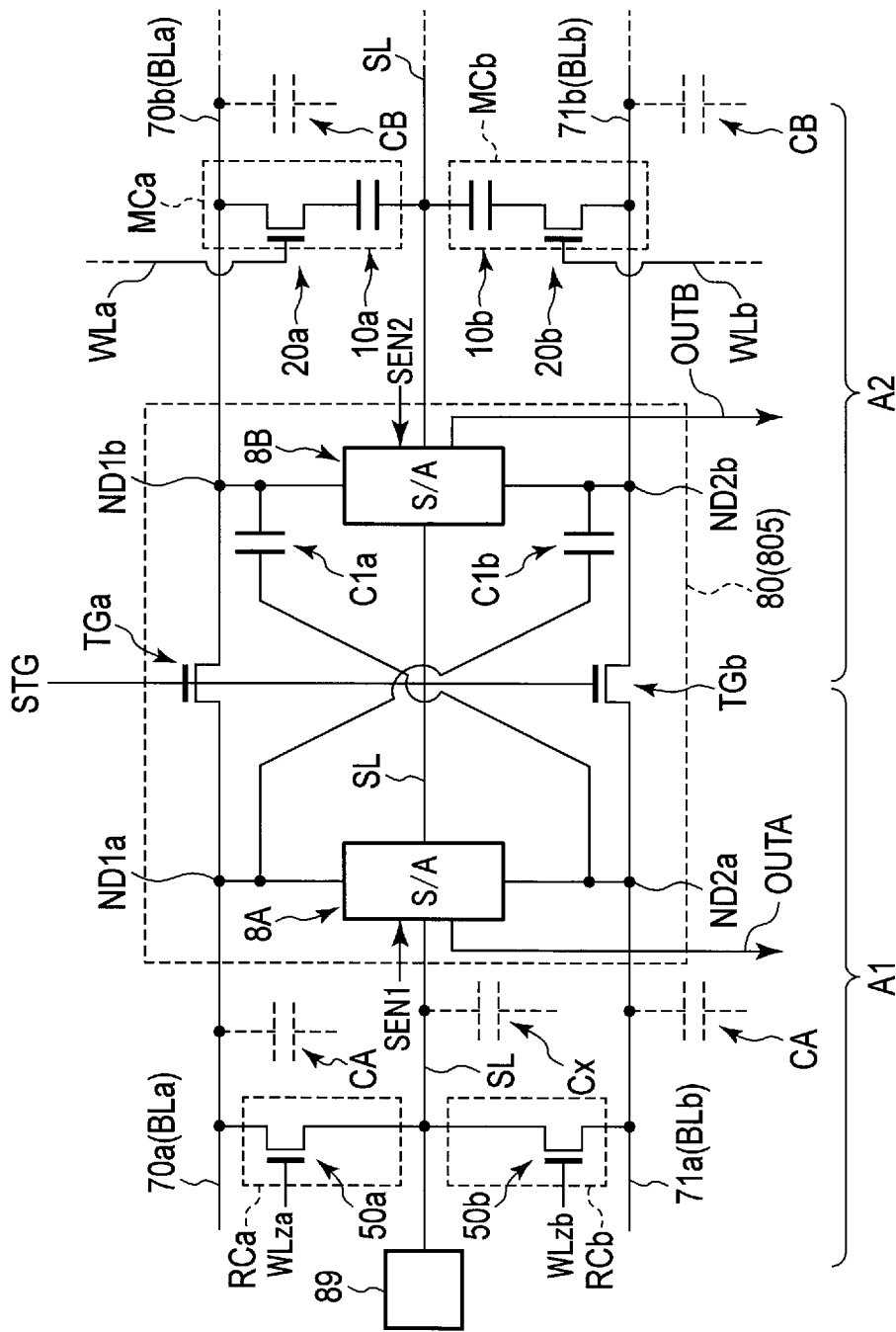
F I G. 7

MEMORY CELL ARRAY HAVING THREE-DIMENSIONAL STRUCTURE

CROSS-REFERENCE TO RELATED APPLICATIONS

This application is based upon and claims the benefit of priority from Japanese Patent Application No. 2019-054481, filed Mar. 22, 2019, the entire contents of which are incorporated herein by reference.

FIELD

Embodiments described herein relate generally to a semiconductor memory.

BACKGROUND

In memory devices such as a semiconductor memory, multi-level technology for memory cells has been studied and developed to improve the memory density of the memory cells.

BRIEF DESCRIPTION OF THE DRAWINGS

FIG. 4 is an illustration showing an example of a structure of a memory cell of the semiconductor memory according to the embodiment.

FIG. 7 is a schematic diagram showing an example of a configuration of a sense amplifier circuit of the semiconductor memory according to the embodiment.

DETAILED DESCRIPTION

Figure 1:
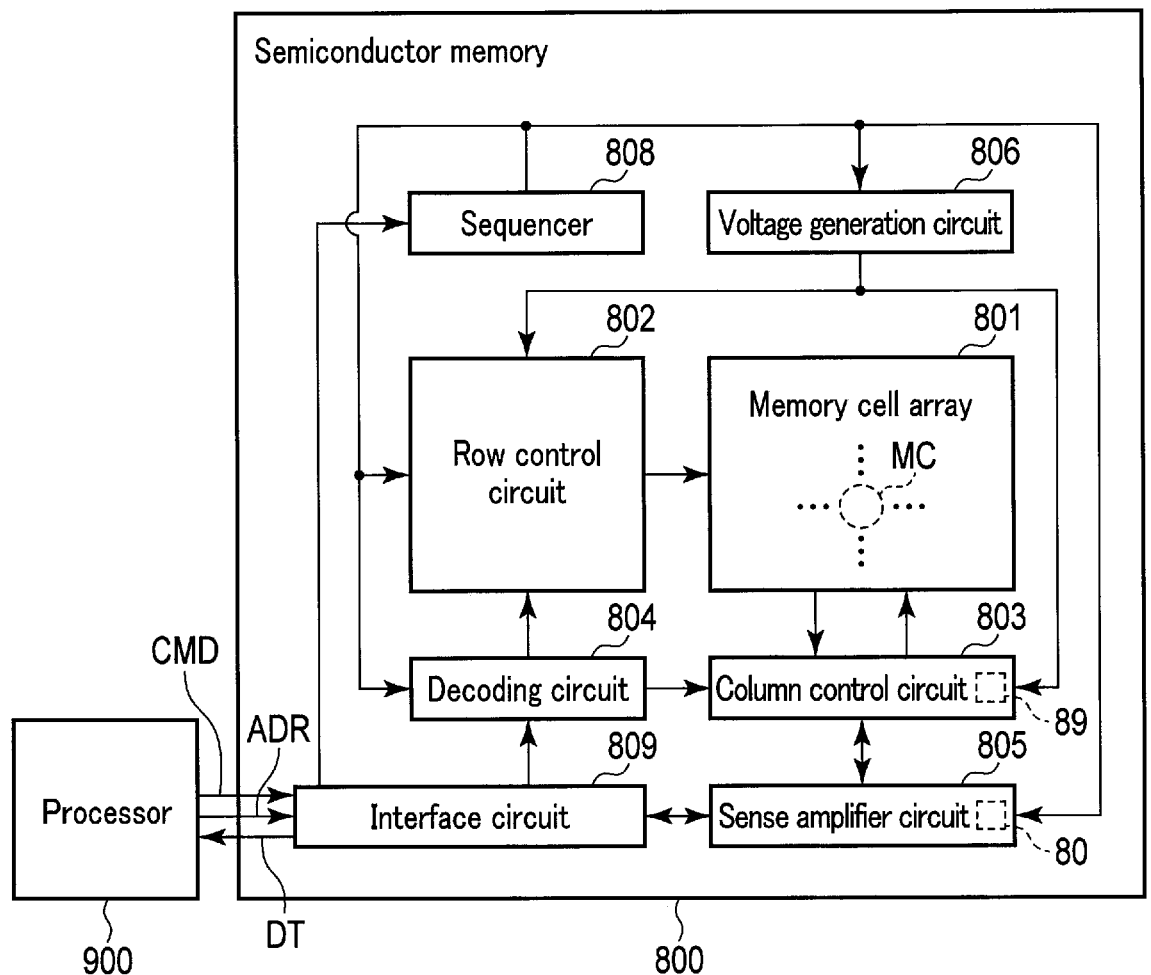
FIG. 1 is a block diagram showing an example of a configuration of a semiconductor memory according to an embodiment.

An embodiment will be described in detail below with reference to the drawings. In the following descriptions, the elements having the same function and configuration are denoted by the same reference numeral or sign.

If the elements denoted by reference signs having numerals or letters at their ends (e.g. word lines W, bit lines BL, and various voltages and signals) need not be distinguished from one another, the numerals or letters will be excluded.

In general, according to one embodiment, a semiconductor memory includes a first bit line; a second bit line; a source line; a first memory cell electrically connected between the first bit line and the source line and including a first transistor and a first capacitor; a second memory cell electrically connected between the second bit line and the source line and including a second transistor and a second capacitor; a third transistor electrically connected to the source line; and a sense amplifier circuit including a first node electrically connected to the first bit line and a second node electrically connected to the second bit line.

Embodiment

A semiconductor memory according to an embodiment will be described with reference to FIGS. 1 through 10.

(1) Example of Configuration

An example of a configuration of the semiconductor memory according to the embodiment will be described with reference to FIGS. 1 through 6.

<Overall Configuration>

FIG. 1 is a block diagram illustrating a system including the semiconductor memory according to the present embodiment.

As illustrated in FIG. 1, a semiconductor memory (memory device) 800 is connected to a processor 900 through interconnect or wireless communication in a system. Between the semiconductor memory 800 and the processor 900, a variety of signals such as a command CMD, an address ADR, data DT and a control signal are received and transmitted.

The semiconductor memory 800 includes a memory cell array 801, a row control circuit 802, a column control circuit 803, a decoding circuit 804, a sense amplifier circuit 805, a voltage generation circuit 806, a sequencer 808, an interface circuit 809 and the like.

The memory cell array 801 includes a plurality of memory cells MC. Each of the memory cells MC is connected to a plurality of interconnects such as bit lines and word lines. The memory cells MC can store data of one or more bits. The internal configuration of the memory cell array 801 will be described later.

The interface circuit 809 receives a signal (the command CMD, address ADR, data DT and control signal, etc.) from the processor 900. The interface circuit 809 transmits the received signal to another circuit in the semiconductor memory 800.

The interface circuit 809 also transmits data read from the memory cell array 801, to the processor 900.

The decoding circuit 804 decodes the address ADR. Then, the decoding circuit 804 outputs a decoding result of the address ADR to the row control circuit 802 and the column control circuit 803.

The row control circuit 802 controls the rows of the memory cell array 801. Based on the decoding result of the address ADR (row address), the row control circuit 801 selects (activates) at least one from among the rows of the memory cell array 801. The row control circuit 802 renders the rows other than the selected row in a non-selected state (inactive state).

The row control circuit 802 includes a word line driver circuit, a switch circuit (selector) and the like.

The column control circuit 803 controls the columns of the memory cell array 801. Based on the decoding result of the address ADR (column address), the column control circuit 803 selects (activates) at least one from among the columns of the memory cell array 801. The column control circuit 803 renders the columns other than the selected column in a non-selected state (inactive state).

The column control circuit 803 includes a bit line driver circuit, a switch circuit (selector) and the like. In the present embodiment, the column control circuit 803 includes a source line control circuit (source line driver circuit) 89.

The sense amplifier circuit 805 is connected to the memory cell array 801 via the column control circuit 803. To read data of a selected memory cell MC, the sense amplifier circuit 805 senses and amplifies a signal corresponding to the data. Based on a sensing result of the signal, the data is read of the selected memory cell MC. When data is written to a selected memory cell MC, the sense amplifier circuit 805 can control the potential of interconnect connected to the selected memory cell MC, in accordance with the data to be written to the memory cell MC.

For example, the sense amplifier circuit 805 includes a plurality of sense amplifiers 80. Each of the sense amplifiers 80 corresponds to one or more bit lines.

Hereinafter, a memory cell that is selected as a target to be operated at the time of data read (read operation) and data write (write operation) will be referred to as a selected cell. A memory cell that is not selected as a target to be operated will be referred to as a non-selected cell.

In accordance with an operation to be performed for the memory cell array 801, the voltage generation circuit 806 generates a plurality of voltages for the operation. The voltage generation circuit 806 outputs the generated voltage to the row control circuit 802, column control circuit 803 and sense amplifier circuit 805.

The sequencer 808 controls the operations of a plurality of circuits 802 to 806 in the memory device 800 in response to the command CMD and control signal.

The semiconductor memory 800 of the present embodiment is, for example, a dynamic random access memory (DRAM). In the DRAM 800, each memory cell MC includes at least one capacitor and at least one transistor. The capacitor is used as a memory element (data holding element) of the memory cell MC. The transistor is used as a selection element (switch element) of the memory cell MC. Hereinafter, the transistor in the memory cell MC will be referred to as a cell transistor.

(1a) Example of Configuration of Memory Cell Array
<Example of Circuit>

Figure 2:
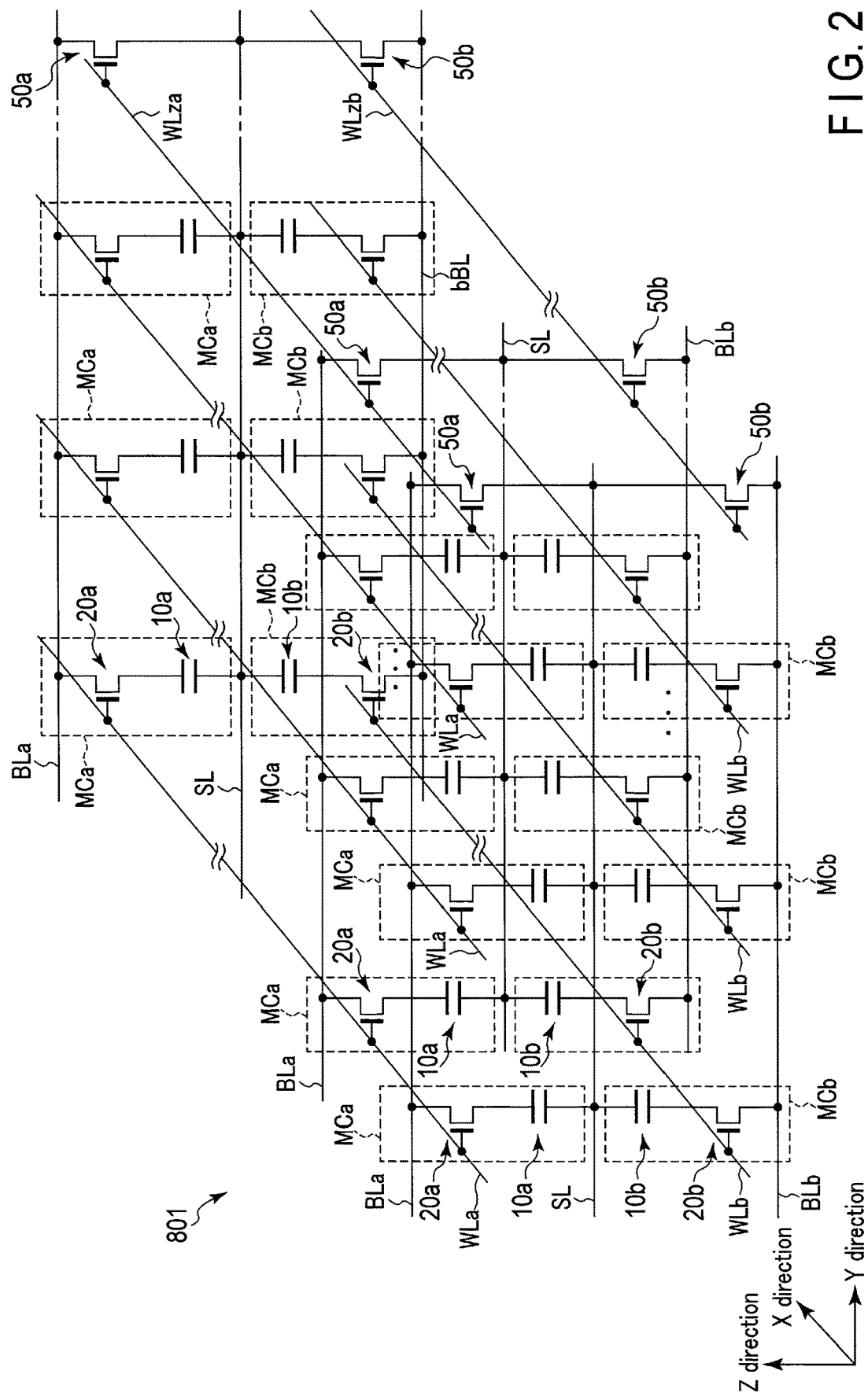
FIG. 2 is a circuit diagram showing an example of a configuration of a memory cell array of the semiconductor memory according to the embodiment.

FIG. 2 is an equivalent circuit diagram showing an example of a memory cell array of the memory device (e.g. DRAM) according to the present embodiment.

The memory cell array 801 includes a plurality of memory cells MC, a plurality of word lines WL (WLa and WLb), a plurality of bit lines BL (BLa and BLb) and a plurality of source lines SL.

The word lines WL are connected to the row control circuit 802. The bit lines BL and source lines SL are connected to the column control circuit 803. The bit lines BL and source lines SL are also connected to the sense amplifier circuit 805 via the column control circuit 803.

For example, the DRAM 800 of the present embodiment includes a memory cell array 801 having a three-dimensional structure. In the memory cell array 801, the memory cells MC are arranged in two dimensions within the X-Y plane and arranged in the Z direction perpendicular to the X-Y plane.

The memory cells MC arranged in the X direction are connected to a common word line WL.

The memory cells MC arranged in the Y direction are connected to a common bit line BL and a common source line SL.

In the present embodiment, each of the memory cells MC includes a capacitor 10 and a cell transistor 20. For example, in each of the memory cells MC, the capacitor 10 and the cell transistor 20 are connected to its corresponding bit line BL, source line SL and word line WL. One terminal of the cell transistor 20 (one of the two source/drains, one end of a current path) is connected to the bit line BL. The other terminal of the cell transistor 20 (the other of the two source/drains, one end of the current path) is connected to one terminal of the capacitor 10. The other terminal of the capacitor 10 is connected to the source line SL.

The gate of the cell transistor 20 is connected to the word line WL.

For example, the transistor 50 (50a and 50b) is provided at an end portion of the memory cell array 801 in the Y direction.

One terminal of the transistor 50 is connected to the bit line BL. The other terminal of the transistor 50 is connected to the source line SL. The gate of the transistor 50a is connected to a word line WLza. The gate of the transistor 50b is connected to a word line WLzb.

In the transistor 50, no capacitor is provided between the transistor 50 and the source line SL.

During a desired operation for the memory cell MC, the transistor 50 as well as the cell transistor 20 is set in on state. The transistor 50 contributes to the operation of the memory cell MC. The transistor 50 functions as a selection element of the memory cell MC.

For example, when a memory cell MCa between the bit line BLa and the source line SL is selected in accordance with an operation to be performed by the DRAM, the transistor 50b is activated. In contrast, when a memory cell MCb between the bit line BLb and the source line SL is selected, the transistor 50a is activated. Thus, during the operation for the memory cell MC, the capacitor 10 is connected to the two bit lines BLa and BLb through the two transistors 20 and 50.

For differentiation in the following descriptions, the transistor 50 will also be referred to as a replica transistor (or a dummy transistor) 50.

<Example of Structure>

Figure 3:
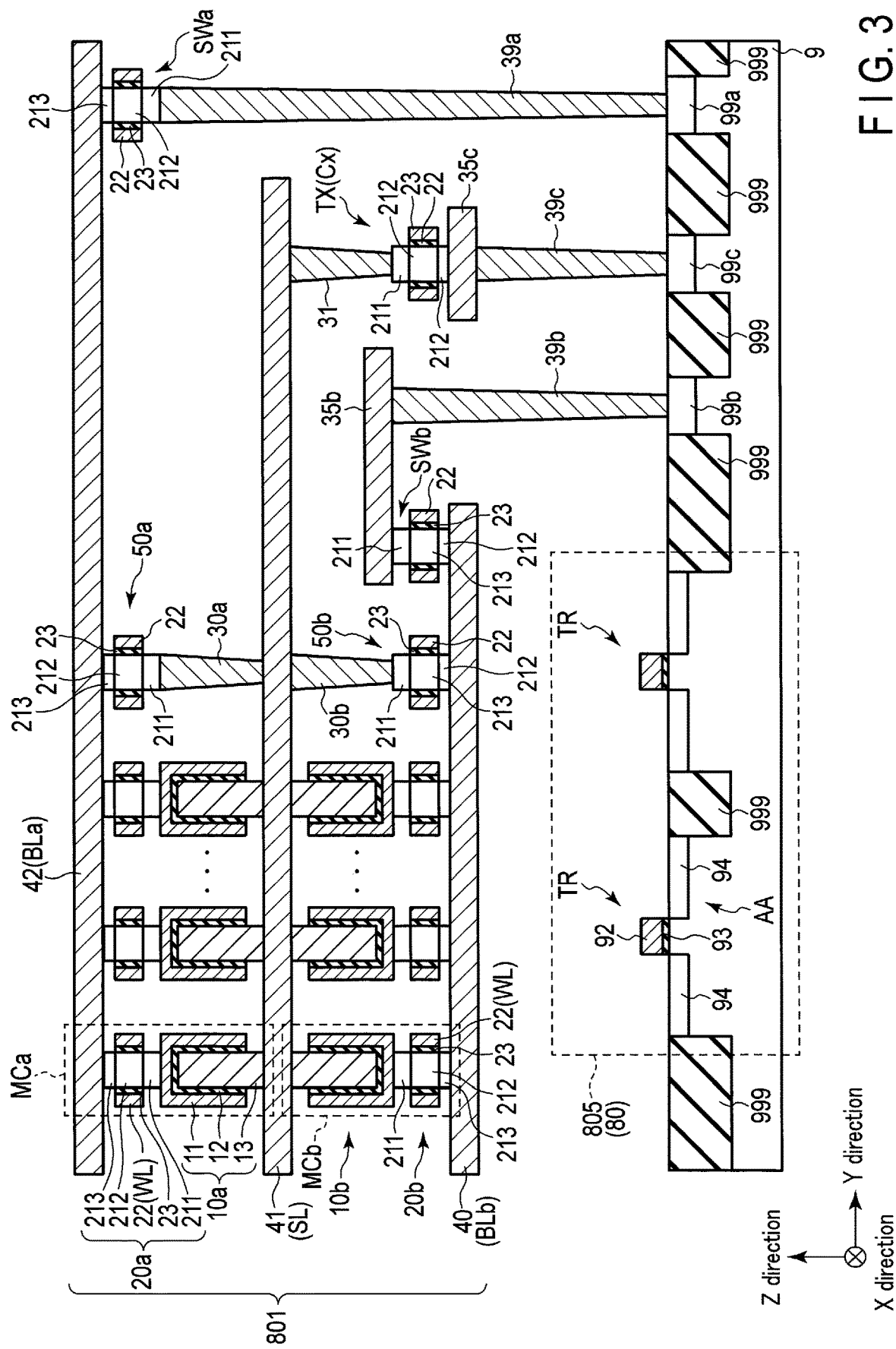
FIG. 3 is a sectional view showing an example of a configuration of the memory cell array of the semiconductor memory according to the embodiment.

FIG. 3 is a schematic view illustrating an example of a structure of a memory cell array of the DRAM according to the present embodiment. In FIG. 3, the sectional structure of the memory cell array is shown schematically. In FIG. 3, an insulation layer (e.g. an interlayer insulation film) covering the structural elements of the DRAM is omitted.

As shown in FIG. 3, in the DRAM of the present embodiment, the memory cell array 801 is provided above the semiconductor substrate 9 via an interlayer insulation film (not shown) therebetween.

A plurality of cell transistors 20b are provided above a conductive layer (interconnect) 40 extending in the Y direction. The conductive layer 40 corresponds to the bit line BLb (or part thereof).

Each capacitor 10b is provided above its corresponding transistor 20b.

A conductive layer 41 extends in the Y direction and is provided above the capacitors 10b. The conductive layer 41 corresponds to the source line SL (or part thereof).

A plurality of capacitors 10a are provided on the source line SL.

Each cell transistor 20a is provided above its corresponding capacitor 10a.

A conductive layer 42 extends in the Y direction and is provided above the cell transistors 20a. The conductive layer 42 corresponds to the bit line BLa (or part thereof).

In the DRAM of the present embodiment, therefore, the capacitor 10 (10a and 10b) and the cell transistor 20 (20a and 20b) are stacked in a direction (Z direction) perpendicular to the surface of the semiconductor substrate 9.

Thus, the memory cell array 801 having a three-dimensional structure is configured.

In the memory cell MC, the capacitor 10 (10a and 10b) includes two conductive layers 11 and 13 and an insulation layer 12. The insulation layer 12 is provided between the two conductive layers 11 and 13.

The conductive layers 11 and 13 are electrodes of the capacitor 10. For differentiation in the following descriptions, the conductive layers 11 and 13 will be referred to as capacitor electrodes 11 and 13. The insulation layer 12 is a dielectric between the capacitor electrodes 11 and 13. The insulation layer 12 will be referred to as a capacitor insulation film 12.

The capacitor 10 can hold electric charges. The capacitance Cs of the capacitor 10 is set as appropriate in accordance with the control of the opposing area of the two capacitor electrodes 11 and 13, the dielectric constant of materials of the capacitor insulation film 12, the thickness of the capacitor insulation film 12 and the like.

The cell transistor 20 (20a and 20b) includes a plurality of semiconductor layers 211, 212 and 213, a gate electrode 22 and a gate insulation film 23.

The gate insulation film 23 is provided on the side surface of the semiconductor layer 212. The side surface of the semiconductor layer 212 is substantially perpendicular to the surface (X-Y plane) of the semiconductor substrate 9.

The gate electrode 22 is opposed to the side surface of the semiconductor layer 212 with the gate insulation film 23 therebetween. The gate electrode 22 extends in the X direction. The gate electrode 22 is used as a word line WL.

The semiconductor layer 212 is provided between the two semiconductor layers 211 and 213 in the Z direction. The semiconductor layers 211 and 213 are source/drain layers 211 and 213 of the cell transistor 20. The semiconductor layer 212 is a channel layer (channel region) of the cell transistor 20. When the gate voltage of the cell transistor 20 is not lower than the threshold voltage of the cell transistor 20, a channel is formed in the channel layer 212.

The current path of the cell transistor 20 is set in a direction substantially perpendicular to the surface (X-Y plane) of the semiconductor substrate 9. This transistor 20 will be referred to as a vertical transistor.

FIG. 4 is a bird's-eye view showing an example of a configuration of the capacitor and the cell transistor used in the memory cell.

For example, the capacitor electrode 13 of the capacitor 10 is cylindrical (or prismatic). One end of the capacitor electrode 13 is connected to the conductive layer (source line) 41. The capacitor insulation film 12 is provided on the capacitor electrode 13 so as to cover the other end and the side surface of the capacitor electrode 13. The capacitor electrode 11 of the capacitor 10 is provided on the capacitor insulation film 12 so as to cover the top surface and side surface of the capacitor insulation film 12.

The capacitance Cs of the capacitor 10 corresponds to the opposing area of the two conductive layers 11 and 13 via the insulation layer 12 therebetween. Note that the capacitance Cs may be controlled by the material and film thickness of the insulation layer 12.

For example, the materials of the conductive layers 11 and 13 are selected from metal, a semiconductor, a conductive compound and the like. The material of the insulation layer 12 is selected from silicon oxide, silicon nitride, silicon oxynitride, high dielectric material, and the like.

In the cell transistor 20, the semiconductor layers 211, 212 and 213 are provided between the capacitor electrode 13 and the conductive layer 42 in the Z direction.

The source/drain layer 211 is provided on the capacitor electrode 11 via, for example, a contact plug 191 therebetween.

The channel layer 212 is stacked on the source/drain layer 211. The source/drain layer 213 is stacked on the channel layer 212.

The gate insulation film 23 is provided on the side surface of the channel layer 212.

The gate electrode 22 is opposed to the side surface of the channel layer 212 via the gate insulation film 23 therebetween.

A contact plug may be provided between the source/drain layer 213 and the conductive layer 42.

The materials of the semiconductor layers 211, 212 and 213 are selected from silicon, silicon germanium, germanium, an oxide semiconductor and the like. For example, the oxide semiconductor is an oxide including at least one of indium (In), gallium (Ga), zinc (Zn), Tin (Sn) and the like. In general, the band gap of the oxide semiconductor is larger than that of silicon. Accordingly, the conductivity of an oxide semiconductor to which no voltage is applied is lower than that of silicon to which no voltage is applied. Therefore, when an oxide semiconductor (e.g. InGaZnO) is used in the semiconductor layers 211, 212 and 213, the cut-off characteristics of the cell transistor 20 is improved and the leakage current is reduced. As a result, the data retention characteristics of the memory cell MC is improved.

Note that the structure of the memory cell MC is not limited to the structures shown in FIGS. 3 and 4.

For example, the transistor 50 (50a and 50b) is provided at the end of the memory cell array 801 in its Y direction.

The transistor 50 has substantially the same structure as that of the cell transistor 20.

The transistor 50 includes a plurality of semiconductor layers 211, 212 and 213, a gate electrode 22 and a gate insulation film 23. The gate electrode 22 is opposed to the semiconductor layer 212 via the gate insulation film 23 therebetween. The semiconductor layer (channel layer) 212 is provided between two semiconductor layers (source/drain layers) 211 and 213 in the Z direction.

One end of the transistor 50a is connected to the bit line BLa. The other end of the transistor 50a is connected to the source line SL via a contact plug 30a. One end of the transistor 50b is connected to the bit line BLb. The other end of the transistor 50b is connected to the source line SL via a contact plug 30b. No capacitor is provided between the transistor 50 and the source line SL.

The capacitance components of the transistor 50 are added to the capacitance of the memory cell MC and/or the capacitance of interconnect (e.g. the bit line BL and the source line SL) for connecting the memory cell MC and the sense amplifier circuit 805. The transistor 50 may adjust the capacitance of the memory cell MC and/or the interconnect capacitance of the bit line BL and the source line SL.

In the lower region of the memory cell array 801, a plurality of circuits 802 to 809 included in the DRAM are provided on the semiconductor substrate 9.

For simplification of FIG. 3, only two field-effect transistors TR are illustrated. However, a plurality of P-type/N-type field-effect transistors TR, a plurality of resistive elements, a plurality of capacitive elements, etc. are provided on the semiconductor substrate 9. These elements compose the circuits 801 to 809 of the DRAM 800.

The transistor TR is provided in the semiconductor region (active region) AA in the semiconductor substrate 9. The semiconductor region is isolated by an element isolating insulation layer 999.

The transistor TR includes two source/drain layers 94. The source/drain layers 94 are provided in the semiconductor region. The gate electrode 92 is provided above the channel region via the gate insulation film 93 therebetween. In the transistor TR, the channel region is provided between the two source/drain layers 94.

The gate electrode 92 and the source/drain layers 94 are connected to an interconnect (not shown) through a contact (not shown).

The circuit including the transistor TR is defined as a sense amplifier circuit 805 in, for example, FIG. 3.

In the DRAM 800 of the present embodiment, the bit line BL is connected to the corresponding sense amplifier 80 of the sense amplifier circuit 805 via a column selection switch SW (SWa and SWb).

The column selection switch (transfer gate) SW is a vertical field-effect transistor. The structure of the column selection switch SW is substantially the same as that of the cell transistor 20. The column selection switch SW includes a channel layer 212, source/drain layers 211 and 213, a gate electrode 22 and a gate insulation film 23. The gate electrode 22 of the column selection switch SW is supplied with a control signal corresponding to an address. Thus, the electrical connection between the sense amplifier 80 and the bit line BL is controlled.

The column selection switch SWa is provided between the bit line BLa and the node of the sense amplifier circuit 805. One terminal (source/drain layer 213) of the column selection switch SWa is connected to the bit line BLa. The other terminal (source/drain layer 211) of the column selection switch SWa is connected to a first terminal (node) of the corresponding sense amplifier 80 via a contact plug 39*a*, a diffusion layer 99*a*, a conductive layer (not shown) and the like.

The column selection switch SWb is provided between the bit line BLb and the node of the sense amplifier circuit 805. One terminal of the column selection switch SWb is connected to the bit line BLb. The other terminal of the column selection switch SWb is connected to a second terminal (node) of the corresponding sense amplifier 80 via a conductive layer 35*b*, a contact plug 39*b*, a diffusion layer 99*b* and the like.

In the present embodiment, a transfer gate TX is provided between the source line SL and the sense amplifier 80. The transfer gate TX is a field-effect transistor. The transfer gate TX has substantially the same structure as those of the column selection switch SW and the cell transistor 20. The transfer gate TX includes a channel layer 212, source/drain layers 211 and 213, a gate electrode 22 and a gate insulation film 23. The gate electrode 22 of the transfer gate TX is supplied with a control signal. Thus, the electrical connection between the sense amplifier 80 and the source line SL is controlled.

One terminal (source/drain layer) of the transfer gate TX is connected to the source line SL (conductive layer 41) via a contact plug 31. The other terminal of the transfer gate TX (source/drain layer) is connected to the sense amplifier 80 via a conductive layer 35*c*, a contact plug 39*c*, a diffusion layer 99*c* and the like. For example, the position (interconnect level) of the conductive layer 35*c* in the Z direction is substantially the same as that of the bit line BLb in the Z direction.

The transfer gate TX has capacitance Cz. The transfer gate TX may operate as part of the interconnect capacitance of the source line SL. The transfer gate TX is provided to adjust the interconnect capacitance of the source line SL. FIG. 3 shows an example where one transfer gate TX is connected to one source line SL; however, two or more transfer gates TX may be connected to one source line SL. The transfer gate for adjusting the capacitance of the source line SL need not be connected to the source line SL.

For example, the contact plugs 39*a*, 39*b* and 39*c* are connected to the sense amplifier circuit 805 via the column control circuit. The contact plugs 39*a*, 39*b* and 39*c* connected in common to the sense amplifier 80 are provided in an area at one end of the memory cell array 801.

The capacitance components of the column selection switch SW and the transfer gate TX may be included as the capacitance of the node of the sense amplifier 80 (the capacitance of interconnect for connecting the memory cell and the sense amplifier circuit).

In the DRAM of the present embodiment, the memory cell MC can hold data of two or more bits. The memory cell that holds data of two or more bits is called a multi-level cell (MLC). Hereinafter, a memory cell that stores 2-bit data ("00," "01," "10" and "11") will be exemplified as the MLC.

Figure 5:
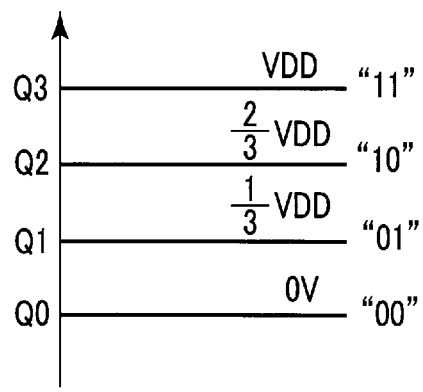
FIG. 5 is a chart illustrating the relationship between signals and data held in a memory cell.

FIG. 5 is a schematic diagram showing the relationship between two-bit data and the amount of charge held in the capacitor. In FIG. 5, the vertical axis represents the amount of charge held in the capacitor.

As shown in FIG. 5, in the MLC that stores 2-bit data, "00" data is associated with a charge amount Q1, "01" data is associated with a charge amount Q2, "10" data is associated with a charge amount Q3 and "11" data is associated with charge amount Q4.

For example, the voltage value of 0 V corresponds to the charge amount Q1 and the voltage value VDD corresponds to the charge amount Q4. The voltage value ($\frac{1}{3}$)×VDD corresponds to the charge amount Q2 and the voltage value ($\frac{2}{3}$)×VDD corresponds to the charge amount Q3. Thus, the configuration of the memory cell MC is set such that the voltage and the charge amount can be associated with each other.

Therefore, the memory cell of the DRAM of the present embodiment functions as an MLC capable of storing 2-bit data.

Figure 6:
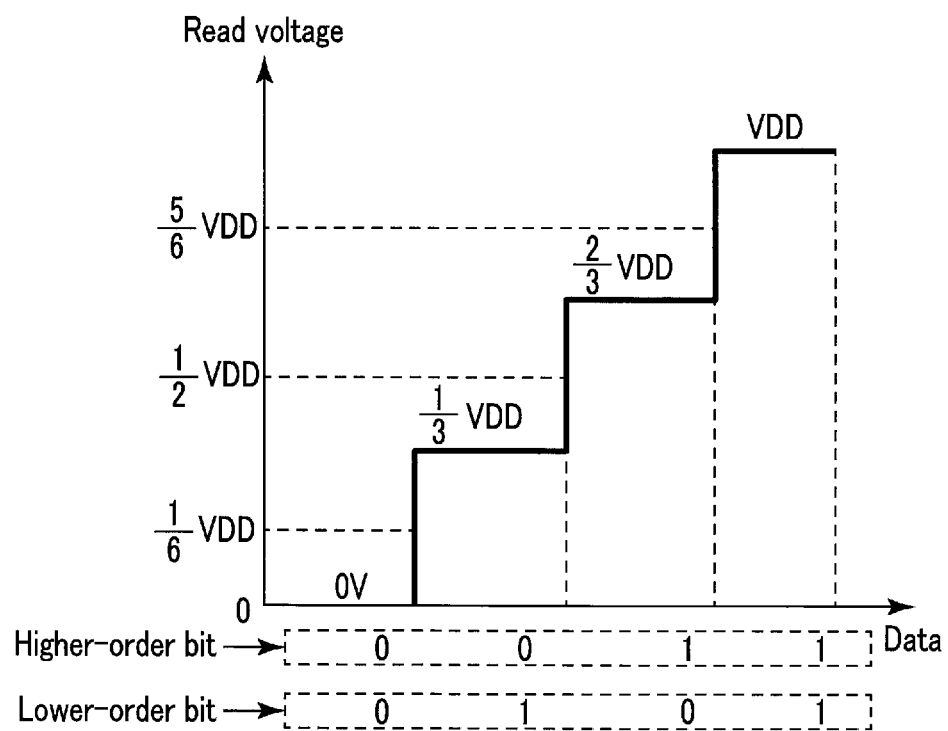
FIG. 6 is a chart illustrating reading of data from a memory cell.

FIG. 6 is a chart showing the relationship between data and read voltage.

In the chart of FIG. 6, the horizontal axis represents read data and the vertical axis represents read voltage.

As described above, the memory cell MC can store "00" data, "01" data, "10" data and "11" data.

In read operation, "1" and "0" of the upper-order bit can be distinguished using a voltage value between the voltage value corresponding to the "01" data and the voltage value corresponding to the "10" data. For example, the voltage value of ($\frac{1}{2}$)×VDD is used as a voltage (reference voltage) to distinguish "0" and "1" of the upper-order bit.

When the upper-order bit is "0," "1" and "0" of the lower-order bit can be distinguished based upon the relationship in magnitude between the voltage value corresponding to the "0" data and the voltage value corresponding to the "01" data. For example, a voltage value (e.g. ($\frac{1}{6}$)×VDD) between 0 V and ($\frac{1}{3}$)×VDD can used to distinguish "1" and "0" of the lower-order bit in data of the upper-order bit of "0."

When the upper-order bit is "1," "1" and "0" of the lower-order bit can be distinguished based upon the relationship in magnitude between the voltage value corresponding to the "10" data and the voltage value corresponding to the "11" data. For example, a voltage value (e.g. (5/6)×VDD) between (2/3)×VDD and VDD can be used to distinguish "1" and "0" of the lower-order bit in data of the upper-order bit of "1."

Thus, 2-bit data (four data) in the memory cell MC can be distinguished.

(1b) Example of Configuration of Sense Amplifier Circuit

An example of a configuration of the sense amplifier circuit in the DRAM of the present embodiment will be described with reference to FIG. 7.

FIG. 7 is an equivalent circuit diagram illustrating the sense amplifier circuit in the DRAM of the present embodiment.

The sense amplifier circuit 805 includes a plurality of sense amplifiers 80. For example, one sense amplifier 80 corresponds to one (or more) bit line pairs (BLa and BLb).

The first node ND1 (ND1a and ND1b) of the sense amplifier 80 is connected to the bit line BLa. The second node ND2 (ND2a and ND2b) of the sense amplifier is connected to the bit line BLb.

In the present embodiment, the sense amplifier 80 is a capacitive coupling type sense amplifier. The capacitive coupling type sense amplifier 80 is so configured that it can read (distinguish) 2-bit data.

The sense amplifier 80 includes a first sense unit 8A, a second sense unit 8B and one or more transfer gates (switching elements) TG.

The first and second sense units 8A and 8B can sense the potential of the bit lines BL. The first and second sense units 8A and 8B can amplify the potential of the bit lines BL.

One input terminal of the first sense unit 8A is connected to a node ND1a and the other input terminal thereof is connected to a node ND2a.

One input terminal of the second sense unit 8B is connected to a node ND1b and the other input terminal thereof is connected to a node ND2b.

The sense unit 8A is connected to the sense unit 8B via capacitors (capacitive coupling) C1a and c1b. The capacitance of the capacitor C1a is substantially the same as that of the capacitor C1b.

The one input terminal of the first sense unit 8A is connected to the one input terminal of the second sense unit 8B via the capacitor C1b. The other input terminal of the first sense unit 8A is connected to the other input terminal of the second sense unit 8B via the capacitor C1b.

The first sense unit 8A is supplied with a control signal SENa. The operation (activation/inactivation) of the first sense unit 8A is controlled in accordance with the signal level of the control signal. SENa.

The second sense unit 8B is supplied with a control signal SENb. The operation (activation/inactivation) of the second sense unit 8b is controlled in accordance with the signal level of the control signal SENb.

The first sense unit 8A senses whether the upper-order bit of data in the memory cell MC is "0" or "1." The signal (potential) corresponding to the value of the upper-order bit is retained (accumulated) in nodes ND1a and ND2a on the area A1 side. The upper-order bit of data in a selected cell is determined using the signal held in the area (holding area or determination area) A1.

The second sense unit 8B senses whether the lower-order bit of data in the memory cell MC is "0" or "1." The signal corresponding to the value of the lower-order bit is retained (accumulated) in nodes ND1b and ND2b on the area A2 side. The lower-order bit of data in a selected cell is determined using the signal held in the area (holding area or determination area) A2.

A transfer gate TG (TGa and TGb) is provided between the first and second sense units 8A and 8B.

One terminal of the transfer gate TGa is connected to the node ND1a and the other terminal thereof is connected to the node ND2a. One terminal of the transfer gate TGb is connected to the node ND1b and the other terminal thereof is connected to the node ND2b. The transfer gates TGa and TGb are supplied with a control signal STG. In response to the control signal STG, the transfer gates TGa and TGb are turned on and turned off.

In the sense amplifier 80, the transfer gate TGa is provided to divide the bit line BLa (interconnect including the bit line BLa) electrically into two first and second portions 70a and 70b.

One terminal of the transfer gate TGa (one end of the current path) is connected to the first portion 70a of the bit line BLa and the other terminal thereof (the other end of the current path) is connected to the second portion 70b of the bit line BLa.

In the sense amplifier 80, the transfer gate TGb is provided to divide the bit line BLb (interconnect including the bit line BLb) electrically into two first and second portions 71a and 71b. One terminal of the transfer gate TGb is connected to the first portion 71a of the bit line BLb and the other terminal thereof is connected to the second portion 71b of the bit line BLb.

The first portion 70a is connected to the node ND1a (one input terminal of the first sense unit 8A) and the first portion 71a is connected to the node ND2a (the other input terminal of the first sense unit 8A).

The second portion 70b is connected to the node ND1b (one input terminal of the second sense unit 8B) and the second portion 71b is connected to the node ND2b (the other input terminal of the second sense unit 8B).

FIG. 7 schematically shows the relationship in the connection of a memory cell and a replica transistor to the sense amplifier 80.

The first sense unit 8A is provided in the area A1 of the sense amplifier 80. The second sense unit 8B is provided in the area A2 of the sense amplifier 80.

The memory cell MC is connected to the sense amplifier 80 on the area. A1 side of the sense amplifier 80. The memory cell MC is connected to the first sense unit 8A via the transfer gates TGa and TGb. The memory cell MC is connected to the second sense unit 8B but not via the transfer gates TGa and TGb.

In this case, it can be considered that two memory cells MCa and MCb are connected between the second portions 70b and 71b. Replica transistors 50a and 50b are connected to the sense amplifier 80 on the area A1 side of the sense amplifier 80. It can be considered that the two replica transistors 50a and 50b are connected between the first portions 70a and 71a.

As described above, in the capacitive coupling type sense amplifier 80, the memory cell MC is provided in the area A2 opposed to the area A1 where the replica transistor 50 is provided.

The source line SL is connected to the source line control circuit 89. The potential of the source line SL can be controlled by the source line control circuit 89. The source line SL may be connected to the sense amplifier 80 via a transfer gate (not shown).

The sense amplifier 80 has capacitances CA and CB. The capacitances CA and CB are due to the interconnect capacitance of the bit lines BLa and BLb connected to the sense units 8A and 8B, the capacitance components (impedance) of the elements TG and 50, and the like.

The source line SL has an interconnect capacitance (hereinafter also referred to as a source line capacitance) Cx.

In the DRAM of the present embodiment, during the read operation, multi-level data is written back (rewritten) to a selected cell MC using the source line SL. The operation of rewriting data to a selected cell is performed through the source line SL.

The value of voltage VRW for writing back data (hereinafter referred to as a writeback voltage) is determined based upon the amount of signal (e.g. potential) held in the interconnect capacitances CA, CB and Cx. The writeback voltage VRW is applied to the source line SL from the sense amplifier 80 (sense amplifier circuit 805).

A signal for use in determining the upper-order bit (a signal held on the area A1 side) is held in the combined capacitance of the interconnect capacitance CA of the first portions 70a and 71a and the interconnect Cx of the source line.

A signal for use in determining the lower-order bit (a signal held on the area A2 side) is held in the interconnect capacitance CB of the second portions 70b and 71b.

The interconnect capacitance on the area A1 side is adjusted and amplified in accordance with the interconnect capacitance Cx of the source line SL.

In the present embodiment, the capacitance ratio among the interconnect capacitances CA, CB and Cx is set as follows.

$$Cx \times CA/(Cx+CA):CB=2:1$$

Thus, the combined capacitance $Cx \times CA/(Cx+CA)$ of the first portions 70a and 71a and the source line SL is set to about twice the interconnect capacitance of the second portions 70b and 71b.

Incidentally, the interconnect capacitance CB can be expressed as follows.

$$CB = Cx \times CA/(2 \times (Cx+CA))$$

In the present embodiment, the amount of signal generated during the read operation (the magnitude of the signal sensed by the sense amplifier) can be increased by increasing the ratio (Cx/Cs) between the capacitance Cx to the capacitance Cs of the memory cell MC. In the present embodiment, even though the capacitance Cs of the memory cell MC is relatively small, the signal amount can be increased by increasing the capacitance of the source line SL.

(2) Example of Operation

Figure 8:
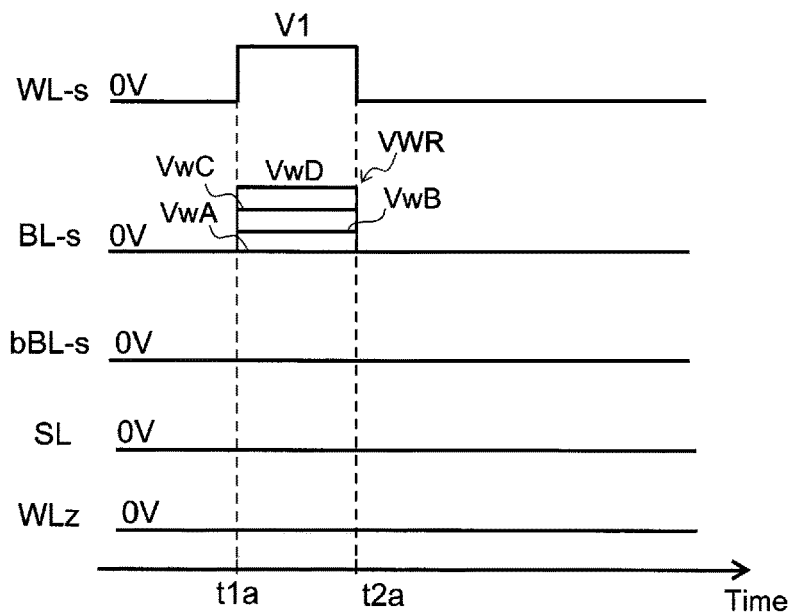
FIG. 8 is a timing chart showing an example of write operation of the semiconductor memory according to the embodiment.
Figure 9:
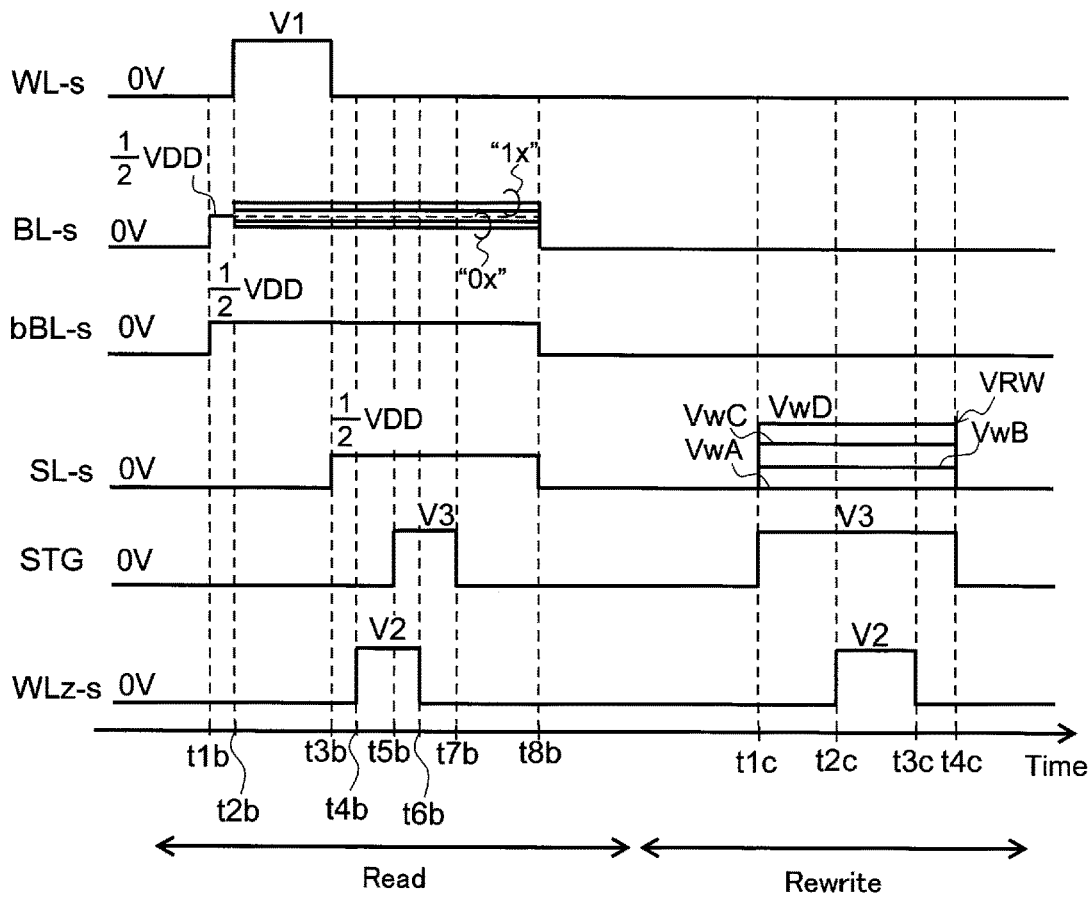
FIG. 9 is a timing chart showing an example of read operation of the semiconductor memory according to the embodiment.

An example of operation (control method) of the semiconductor memory (e.g. DRAM) of the present embodiment will be described with reference to FIGS. 8 and 9. Here, FIGS. 1 through 7 are used appropriately to describe the operation of the semiconductor memory of the present embodiment.

Below is a description of write operation and read operation of the DRAM of the present embodiment when the memory cell stores 2-bit data ("00," "01," "10" and "11").

Hereinafter, the selected bit line will be represented as "BL-s" and a bit line complementary to the selected bit line will be represented as "bBL-s."

(2a) Write Operation

A write operation of the memory device of the present embodiment will be described with reference to FIG. 8.

When data is written to the DRAM, an external device (e.g. CPU) transmits a write command, an address and data (write data) to the DRAM. The external device also transmits a control signal to the DRAM.

The DRAM receives the write command, address, data and control signal.

In response to the write command and the control signal, the DRAM writes the received data to a selected cell corresponding to the address.

In the DRAM 800, the sequencer 808 executes various control operations for the write operation for other circuits.

The decoding circuit 804 decodes the address. The decoding circuit 804 transmits an address decoding result to the row control circuit 802 and the column control circuit 803.

Based on the address decoding result, the row control circuit 802 controls activation/inactivation of the word line WL. Based on the address decoding result, the column control circuit 803 controls activation/inactivation of the bit line BL and the source line SL.

The voltage generation circuit 806 generates various voltages for use in the write operation. The voltage generation circuit 806 applies the generated voltage to other circuits.

At time t1a, a write voltage VWR is applied to the selected bit line BL-s.

A selected voltage V1 is applied to a selected word line WL at substantially the same time when the write voltage is applied to the bit line. The voltage V1 is an on-voltage of the cell transistor 20 (hereinafter also referred to as on-voltage V1). Thus, the cell transistor 20 is set in an on state in the selected cell MC.

The write voltage VWR is applied to the capacitor 10 in the selected cell MC via the on-state cell transistor 20.

Note that at the time of application of the write voltage VWR, the potentials of the selected source line SL-s, complementary bit line bBL-s and replica word line WLz-s are set to 0 V. If, however, a selected voltage is applied to the word line WLz-s, the replica transistor 50 corresponding to the selected cell may be set in an on state.

For example, a non-selected voltage with a predetermined potential (e.g. a voltage higher than 0 V) is applied to the non-selected bit line and the non-selected source line.

In the DRAM of the present embodiment, the voltage value of the write voltage VWR applied to the capacitor 10 is controlled in accordance with data written to the selected cell MC, during the write operation of the MLC that holds 2-bit data.

When data "00" is written to the memory cell MC, the voltage value of the write voltage VWR is set to a voltage value VwA. When data "01" is written to the memory cell MC, the voltage value of the write voltage VWR is set to a voltage value VwB. When data "10" is written to the memory cell MC, the voltage value of the write voltage VWR is set to a voltage value VwC. When data "11" is written to the memory cell MC, the voltage value of the write voltage VWR is set to a voltage value VwD.

For example, the voltage value VwD is a power supply voltage VDD. The voltage value VwC is $(2/3) \times VDD$. The voltage value VwB is $(1/3) \times VDD$. The voltage value VwA is 0 V (ground voltage VSS).

Thus, a potential difference between the selected bit line BL-s and the selected source line SL-s is applied to the selected cell MC as the write voltage VWR.

In the selected cell MC, charges are held (accumulated) in the capacitor 10 in accordance with the voltage value of the write voltage VWR.

As a result, data corresponding to the amount of charge accumulated in the capacitor 10 is written to the selected cell MC. The selected cell MC holds 2-bit data.

Incidentally, the write voltage VWR corresponding to write data may be applied to the selected cell MC by setting the potential of the bit line BL-s to a fixed voltage value (e.g. voltage value Vdd) and setting the potential of the source line SL to a value corresponding to the write data.

At time t2a, the potential of the selected word line WL-s decreases from voltage value V1 to 0 V. Thus, the cell transistor 20 is set in an off state in the selected cell MC. The potential of the selected bit line BL-s decreases from the write voltage VWR to 0 V. Thus, the application of the write voltage to the selected cell is stopped.

As described above, the write operation of the DRAM of the present embodiment is completed.

(2b) Read Operation

A read operation of the DRAM of the present embodiment will be described with reference to FIG. 9.

As will be described below, in the DRAM, the sequence of read operation includes reading of data and rewriting of data. Here is a description of the read operation of the DRAM of the present embodiment in the case where a memory cell MCa between the bit line BLa and the source line SL is selected.

<Reading of Data>

The capacitor 10 of the memory cell MC holds a capacitor voltage VC corresponding to data to be stored by the foregoing MLC write operation. When the memory cell MC stores 2-bit data, the upper-order bit of data and the lower-order bit of data are read (determined) from the selected cell MC.

During the read operation performed for the DRAM 800, the processor 900 transmits a read command CMD, an address ADR, a control signal and the like to the DRAM 800.

Substantially similar to the write operation, the sequencer 808 controls the operation of each of the circuits 802 to 806 in order to perform a read operation based on the received read command and control signal. Based on the address ADR, the selected bit lines BL-s and bBL-s, the selected source line SL-s, the selected word line WL-s, etc. are activated in sequence.

At time t1b, the selected bit line BL-s (here, bit line BLa) and bit line bBL-s (here, bit line BLb) are precharged to a predetermined potential by the column control circuit 803 or the sense amplifier circuit 805. The potentials of the selected bit lines BL-s and bBL-s are set to, for example, ($\frac{1}{2}$)×VDD. Like the potentials of the selected bit lines BL-s and bBL-s, the potential of the non-selected bit line is set to, for example, ($\frac{1}{2}$)×VDD. Note that the non-selected bit line may be set in an electrically floating state.

At time t2b, the voltage VWL of voltage value V1 is applied to the selected word line WL-s by the row control circuit 802. Accordingly, the cell transistor 20 is set in an on state. When the on-voltage V1 is applied to the selected word line WL-s, 0 V (ground voltage VSS) is applied to the non-selected word line. Accordingly, the non-selected cell is maintained in an off state. The capacitor 10 of the non-selected cell is electrically isolated from the bit lines BLa and BLb by the off-state cell transistor.

During the on state of the cell transistor 20 of the selected cell MC, the sense amplifier circuit 805 (or the column control circuit 803) applies a read voltage VRD to the selected cell MC. The read voltage VRD is applied to the selected bit line BL-s (and the bit line bBL-s). The voltage value Vr of the read voltage VRD is, for example, ($\frac{1}{2}$)× VDD.

It is determined by the application of the read voltage VRD whether the upper-order bit of data in the selected cell MC is "1" ("11" or "10") or "0" ("01" or "00").

As has been described with reference to FIGS. 5 and 6, when the upper-order bit of data of the selected cell MC is "1" ("11" or "10"), the potential of the capacitor 10 of the selected cell MC is higher than the voltage ($\frac{1}{2}$)×VDD applied to the selected bit line BL-s.

In this case, the charge of the capacitor 10 in the selected cell MC moves to the selected bit line BL-s. Accordingly, the potential of the bit line BL-s increases and the potential of the capacitor 10 decreases.

For example, when the selected cell MC stores data "11," the potential of the selected bit line BL-s increases by the value of $\Delta$V. In this case, the potential of the selected bit line BL-s is ($\frac{1}{2}$)×VDD+$\Delta$V. "$\Delta$V" substantially corresponds to the absolute value of signal voltage Vs of the capacitor 10 that holds the data "11."

When the selected cell MC stores data "10," the potential of the selected bit line BL-s increases by the value of ($\frac{1}{3}$)×$\Delta$V. In this case, the potential of the selected bit line BL-s is ($\frac{1}{2}$)×VDD+($\frac{1}{3}$)×$\Delta$V.

When the upper-order bit of data of the selected cell MC is "0," the potential of the capacitor of the selected cell MC is lower than the voltage ($\frac{1}{2}$)×VDD applied to the selected bit line BL-s.

In this case, the charge of the bit line BL-s moves to the capacitor 10 in the selected cell MC. As a result, the potential of the selected bit line BL-s decreases and the potential of the capacitor 10 increases.

For example, when the selected cell MC stores data "00," the potential of the selected bit line BL-s decreases by the value of $\Delta$V (=Vs) from ($\frac{1}{2}$)×VDD. In this case, the potential of the selected bit line BL-s is ($\frac{1}{2}$)×VDD−$\Delta$V.

When the selected cell MC stores data "01," the potential of the selected bit line BL-s decreases by the value of ($\frac{1}{3}$)×$\Delta$V from ($\frac{1}{2}$)×VDD. In this case, the potential of the selected bit line BL-s is ($\frac{1}{2}$)×VDD−($\frac{1}{3}$)×$\Delta$VS.

After a period of time during which the potential of the selected bit line BL-s changes has elapsed, the potential of the selected word line WL-s varies from voltage value V1 to 0 V at time t3b.

At time t3b, the potential of the selected source line SL transitions to a potential (e.g. ($\frac{1}{2}$)×VDD) from 0 V by the source line control circuit 89. If, at this time, the transfer gate TX serving as a capacitive element is connected to the selected source line SL-s, the transfer gate TX is set in an on state by the control signal (gate voltage).

At time t4b, the potential of a replica word line (hereinafter referred to as a selected replica word line) WLz-s corresponding to the selected word line WL-s transitions to voltage V2 from 0 V by the row control circuit 802. Accordingly, the replica transistor 50 is set in an on state. In this example, the selected cell MC is provided between the bit line BLa and the source line SL. In this case, a replica transistor 50b between the bit line BLb and the source line SL is set in an on state. On the other hand, a replica transistor 50a between the bit line BLa and the source line SL is maintained in an off state.

At time t5b, the signal level of the control signal STG shifts from an "L" level to an "H" level. The "L" level of the control signal STG corresponds to 0 V. The "H" level of the control signal STG corresponds to voltage V3. The voltage V3 is an on-voltage of the transfer gate TG.

The transfer gate TG is set in an on state by the application of the voltage V3.

Thus, the selected bit lines BL-s and bBL-s are electrically connected to the nodes ND1a and ND2a of the sense unit 8A via the on-state transfer gate TG. The voltage corresponding to data of the selected cell MC is held at the node ND1a.

For example, the potential of the selected replica word line WLz-s shifts from voltage V2 to 0 V while the control signal STG is at an "H" level (e.g., at time t6b). Accordingly, the replica transistor 50 is set in an off state.

At time t7b, the signal level of the control signal STG shifts from an "H" level to an "L" level. Accordingly, the transfer gate TG is set in an off state.

The potentials of the selected bit lines BL-s and bBL-s are held in the nodes ND1a and ND2a in the sense amplifier 80. Thus, the potentials of the selected bit lines BL-s and bBL-s corresponding to the reading result of the upper-order bit of the selected cell MC, are transferred to the holding area (determination area) A1 of the upper-order bit of the sense amplifier 80.

The sense unit 8A is activated by the control signal SEN1 (e.g. "H" level signal SEN1). The sense unit 8A senses and amplifies the potentials of the nodes ND1a and ND2a.

Based on the sensing result of the sense unit 8A, "1" data or "0" data is output from the output terminal OUTA of the sense unit 8A as data of the upper-order bit of the selected cell MC.

Data of the lower-order bit of the selected cell MC is determined by the sense unit 8B. The sense unit 8B is activated by the control signal SEN2 (e.g. "H" level signal SEN2).

The sense unit 8B senses and amplifies the potentials of the nodes ND1b and ND2b.

As described above, the sense unit 8A is connected to the sense unit 8B by capacitive coupling including capacitances C1 and C2. The ratio between the interconnect capacitance CA for holding data of upper-order bit and the interconnect capacitance CB for holding data of lower-order bit is 2:1.

When the upper-order bit is "1," the signal (potential) is amplified to increase the potential of the node ND1a to the voltage value VDD and decrease the potential of the node ND2a to 0 V.

The capacitances C1 and C2 are set such that the potentials of the nodes ND1b and ND2b are varied only by $(1/3) \times \Delta V$ under the influence of variations in the potentials of the nodes ND1a and ND2a at the time of sensing of the of upper-order bit.

When the selected cell MC stores "11" data, the potential of the bit line BL-s (e.g. the potential of the first portion 71a) is $(1/2) \times VDD + \Delta V$ and the potential of the bit line bBL-s (e.g. the potential of the second portion 71b) is $(1/2) \times VDD$ before the amplification of a signal for reading upper-order data.

The potentials of the nodes ND1a and ND2a are varied by the amplification of the signal for reading upper-order data to decrease the potential of the node ND1b only by $(1/3) \times \Delta V$ and increase the potential of the node ND2b only by $(1/3) \times \Delta V$.

If, therefore, the data of the selected cell MC is "11" data, the potential of the node ND2b becomes lower than that of the node ND1b after the amplification of the signal for reading upper-order data.

When the selected cell MC stores "10" data, the potential of the bit line BL-s (e.g. the potential of the first portion 71a) is $(1/2) \times VDD + (1/3) \times \Delta V$ and the potential of the bit line bBL-s (e.g. the potential of the second portion 71b) is $(1/2) \times VDD$ before the amplification of a signal for reading upper-order data.

The potentials of the nodes ND1a and ND2a are varied by the amplification of the signal for reading upper-order data to decrease the potential of the node ND1b only by $(1/3) \times \Delta V$ and increase the potential of the node ND2b only by $(1/3) \times \Delta V$.

If, therefore, the data of the selected cell MC is "10" data, the potential of the node ND2b becomes higher than that of the node ND1b after the amplification of the signal for reading upper-order data.

As described above, when the upper-order bit is "1," it can be determined whether the lower-order bit of the data is "1" or "0" based on a voltage value sensed at the time of reading of the upper-order bit.

When the upper-order bit is "0," the signal amplification decreases the potential of the node ND1a to 0 V and increase the potential of the node ND2a to the voltage value VDD.

When the selected cell MC stores "00" data, the potential of the bit line BL-s (e.g. the potential of the first portion 71a) is $(1/2) \times VDD - \Delta V$ and the potential of the bit line bBL-s (e.g. the potential of the second portion 71b) is $(1/2) \times VDD$ before the amplification of a signal for reading upper-order data.

The potentials of the nodes ND1a and ND2a are varied by the amplification of the signal for reading upper-order data to increase the potential of the node ND1b only by $(1/3) \times \Delta V$ and decrease the potential of the node ND2b only by $(1/3) \times \Delta V$.

If, therefore, the data of the selected cell MC is "00" data, the potential of the node ND1b becomes lower than that of the node ND2b after the amplification of the signal for reading upper-order data.

When the selected cell MC stores "01" data, the potential of the bit line BL-s (e.g. the potential of the first portion 71a) is $(1/2) \times VDD - (1/3) \times \Delta V$ and the potential of the bit line bBL-s (e.g. the potential of the second portion 71b) is $(1/2) \times VDD$ before the amplification of a signal for reading upper-order data.

The potentials of the nodes ND1a and ND2a are varied by the amplification of the signal for reading upper-order data to increase the potential of the node ND1b only by $(1/3) \times \Delta V$ and decrease the potential of the node ND2b only by $(1/3) \times \Delta V$.

If, therefore, the data of the selected cell MC is "01" data, the potential of the node ND1b becomes higher than that of the node ND2b after the amplification of the signal for reading upper-order data.

As described above, when the upper-order bit is "0," it can be determined whether the lower-order bit of the data is "1" or "0" based on a voltage value sensed at the time of reading of the upper-order bit.

The potential corresponding to the lower-order bit of data is held in the nodes ND1b and ND2b of the holding area (determination area) A2 of the lower-order bit of the sense amplifier 80.

The sense unit 8B senses and amplifies the potentials of the nodes ND1b and ND2b. Thus, the potential of the node ND1b is set at the voltage value VDD when the lower bit of the data is "1" and the potential of the node ND1b is set at 0 V when the lower bit is "0." For example, the sense unit 8A is set in an off state before the sense unit 8B amplifies the potentials.

Based on the sensing result in the sense unit 8B, "1" data or "0" data is output from the output terminal OUTB of the sense unit 8B as data of the lower-order bit of the selected cell MC.

After that, the sense unit 8B is inactivated by the control signal SEN2.

For example, at time t8b, the bit lines BL-s and bBL-s and the source line SL-s are inactivated.

As described above, 2-bit data is read from the selected cell MC.

Data in the selected cell MC is destroyed by reading of the data (change in the amount of charge of the capacitor 10). Therefore, after data is read, the data is written back (rewritten) based on the result of the reading.

<Writeback of Data>

The writeback of data to the MLC in the DRAM of the present embodiment will be described with reference to FIG. 9.

In the foregoing reading of data, a voltage value corresponding to a result of the reading is held in the interconnect capacitances CA, CB and Cx between the sense amplifier 80 and the memory cell MC.

Using the potential held in the interconnect capacitances CA, CB and Cx, a voltage for writeback of data (hereinafter referred to as a writeback voltage) is determined.

The voltage value corresponding to the upper-order bit of the data is held in the interconnect capacitance CA of the first portions 70a and 71a. The voltage value corresponding to the lower-order bit of the data is held in the interconnect capacitance CB of the second portions 70b and 71b. When the sense units 8A and 8B amplify the signal, the potentials of the portions 70a, 71a, 70b and 71b are set to a voltage value VDD or 0 V in accordance with the sensed data of upper-order and lower-order bits.

At time t1c, when data is written back, the signal level of the control signal STG shifts from the "L" level to the "H" level. In response to the "H" level signal (voltage value V3), the transfer gate (transistor) TG is set in an on state.

Thus, the second portions 70b and 71b of the bit line BL in the area A2 are electrically connected to the first portions 70a and 71a of the bit line BL in the area A1 via the on-state transfer gate TG.

When the read data is "11" data, the potential of the first portion 70a in the holding state of data of the upper-order bit corresponds to the voltage value VDD and the potential of the first portion 71a in the holding state of data of the lower-order bit also corresponds to the voltage value VDD.

Since, in this case, the interconnect capacitance ratio is set to 2:1, the transfer gate TG is turned on and thus the potentials of the electrically connected portions 70 and 71 are $(2/3) \times VDD + (1/3) \times VDD = VDD$.

When the read data is "10" data, the potential of the first portion 70a in the holding state of data of the upper-order bit corresponds to the voltage value VDD and the potential of the first portion 71a in the holding state of data of the lower-order bit is 0 V.

Since, in this case, the interconnect capacitance ratio is set to 2:1, the transfer gate TG is turned on and thus the potentials of the electrically connected portions 70 and 71 are $(2/3) \times VDD + (1/3) \times 0 = (2/3) \times VDD$.

When the read data is "01" data, the potential of the first portion 70a in the holding state of data of the upper-order bit is 0 V and the potential of the first portion 71a in the holding state of data of the lower-order bit corresponds to the voltage value VDD.

Since, in this case, the interconnect capacitance ratio is set to 2:1, the transfer gate TG is turned on and thus the potentials of the electrically connected portions 70 and 71 are $(2/3) \times 0 + (1/3) \times VDD = (1/3) \times VDD$.

When the read data is "00" data, the potential of the first portion 70a in the holding state of data of the upper-order bit is 0 V and the potential of the first portion 71a in the holding state of data of the lower-order bit is also 0 V.

Since, in this case, the interconnect capacitance ratio is set to 2:1, the transfer gate TG is turned on and thus the potentials of the electrically connected portions 70 and 71 are $(2/3) \times 0 + (1/3) \times 0 = 0$ V.

As described above, four different voltage values are obtained in accordance with the read data.

Therefore, writeback voltages VRW of four patterns are determined to correspond to 2-bit data, based on the read data, by the sense amplifier 80.

In accordance with the read data, one voltage value is set as the voltage value of the writeback voltage VRW.

In the present embodiment, the determined writeback voltage VWR is applied to the source line SL-s. The writeback voltage VWR is applied to the selected cell MC via the source line SL-s.

At time t2c, when a signal is set at an "H" level, the potential of the selected replica word line WLz-s transitions from 0 V to voltage V2. When the voltage (on-voltage) V2 is applied, the replica transistor 50 is set in an on state. The bit line BL is connected to the source line SL via the on-state transistor 50. For example, the potential of the selected word line WL-s transitions may be transition from 0 V to voltage V1. Thereby, the cell transistor 20 is set in an on state.

Thus, the writeback voltage VRW is applied to the source line SL in the memory cell array 801 via the bit line BL, the replica transistor 50 and the nodes (interconnects) ND1 and ND2 in the sense amplifier 80.

For example, the voltage of 0V is applied to the selected bit line BL-s. For example, a voltage having the same voltage value as that of the writeback voltage is applied to the bit line bBL-s.

When the read data is "11" data, the potential of the bit line BL-s is set at 0 V and the potential of the source line SL is set at VDD. Thus, the voltage value of the writeback voltage VRD applied to the selected cell MC is VDD (=VwD). When the writeback voltage VRW having this voltage value is applied, "11" data is written to the selected cell MC.

When the read data is "10" data, the potential of the bit line BL-s is set at 0 V and the potential of the source line SL is set at $(2/3) \times VDD$. Thus, the voltage value of the writeback voltage VRW is $(2/3) \times VDD$ (=VwC). When the writeback voltage VRW having this voltage value is applied, "10" data is written to the selected cell MC.

When the read data is "01" data, the potential of the bit line BL-s is set at 0 V and the potential of the source line SL is set at $(1/3) \times VDD$. Thus, the voltage value of the writeback voltage VRW is $(1/3) \times VDD$ (=VwB). When the writeback voltage VRW having this voltage value is applied, "01" data is written to the selected cell MC.

When the read data is "00" data, the potential of the bit line BL-s is set at 0 V and the potential of the source line SL is also set at 0 V. Thus, the voltage value of the writeback voltage VRW is 0 V (=VwA). When the writeback voltage VRW having this voltage value is applied, "00" data is written to the selected cell MC.

At time t3c, after the application of the writeback voltage VRW, the potential of the selected replica word line WLz-s transitions from voltage value V2 to 0 V. Accordingly, the replica transistor 50 is set in an off state.

At time t4c, the signal level (voltage value) of the control signal STG transitions from an "H" level (voltage value V3) to an "L" level (0 V).

The selected bit lines BL-s and bBL-s and the selected source line SL-s are deactivated. The transfer gate TX of the selected source line SL-s is set in an off state.

The rewrite of data to the selected cell is thus completed.

As described above, the read operation for the selected cell is terminated by the read sequence including data read and data rewrite.

(3) Summary

In the semiconductor memory (memory device) of the present embodiment, the capacitive coupling type sense amplifier 80 reads and rewrites multi-level data (bits of two or more digits).

In the semiconductor memory of the present embodiment, when read operation data is rewritten, a writeback voltage is applied to the selected cell via a source line. The writeback voltage applied to the source line is applied to the selected cell. In the semiconductor memory of the present embodiment, therefore, data is rewritten to the selected cell via the source line.

In the present embodiment, the magnitude of capacitive coupling (the interconnect capacitance ratio) is set using the interconnect capacitance of the source line in addition to the interconnect capacitance of the bit wire (interconnect for connecting the memory cell and the sense amplifier). For example, the transfer gate is connected to the source line to adjust (e.g. increase) the interconnect capacitance of the source line.

In the DRAM of the present embodiment, therefore, even though the capacitance Cs of the memory cell MC is relatively small, the signal amount can be increased.

For example, even though the capacitance Cs of the memory cell is 10 fF or less, both the amplification of a signal for determining a multi-level data reading (sensing)/rewriting voltage and the amplification of a signal for reading data can be achieved if the ratio between the interconnect capacitance of the source line SL and the capacitance Cs of the memory cell (Cx/Cs) increases.

Furthermore, the DRAM of the present embodiment can control of the interconnect length/interconnect capacitance of the source line to increase the capacitance between the memory cell and the sense amplifier and adjust the division ratio of the capacitance.

Therefore, the DRAM of the present embodiment makes it possible to increase the signal amount for sensing and rewriting data without designing the interconnect, elements and circuits in a complex layout.

As a result, the DRAM of the present embodiment can improve in its memory characteristics such as memory reliability.

As described above, the semiconductor memory of the present embodiment can improve its characteristics.

(4) Modification

Figure 10:
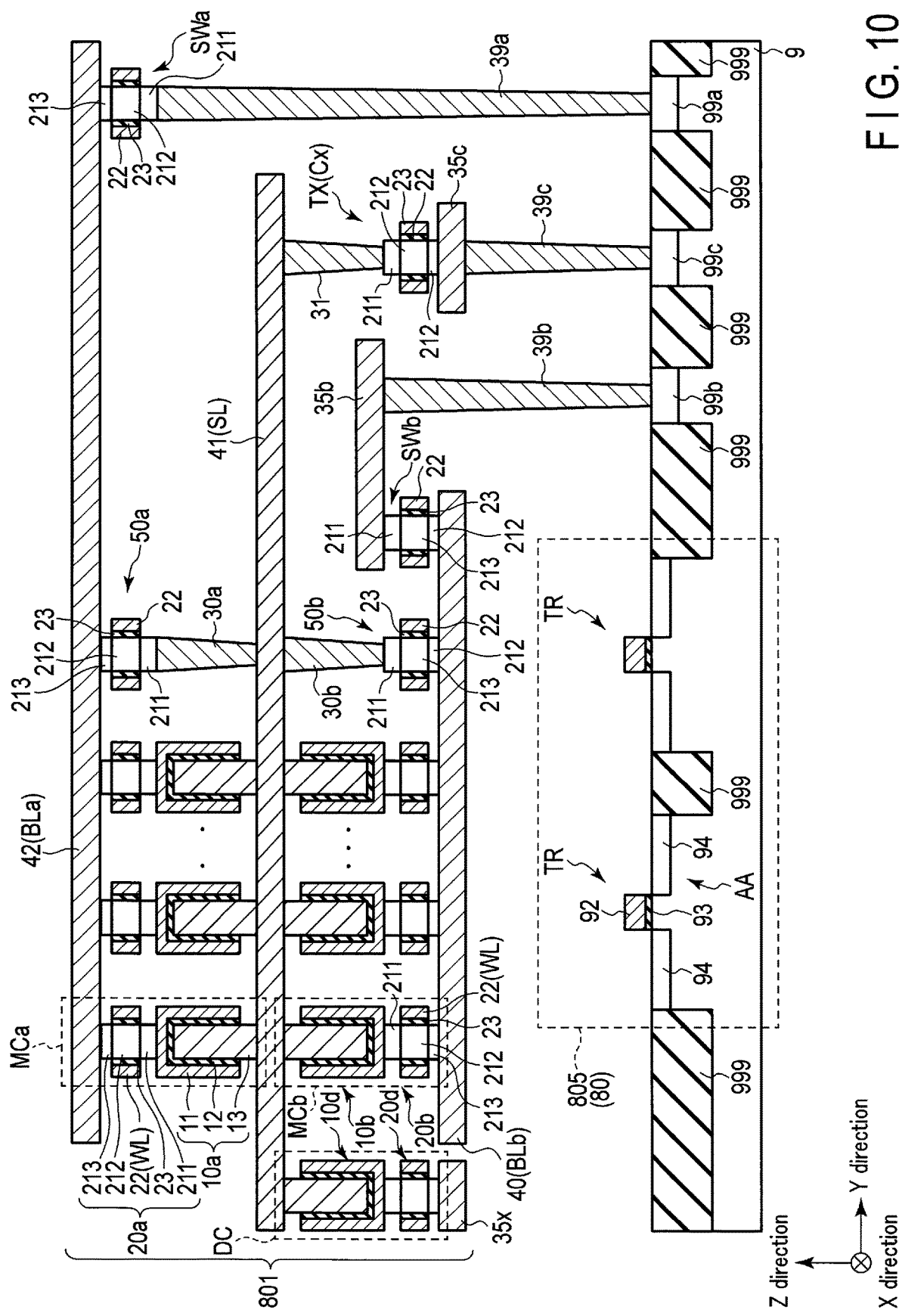
FIG. 10 is a schematic diagram illustrating an example of read operation of the semiconductor memory according to the embodiment.

A modification to the semiconductor memory (e.g. DRAM) of the embodiment will be described with reference to FIG. 10.

A dummy cell DC may be connected to the source line SL. The dummy cell DC includes at least one of a capacitor (hereinafter referred to as a dummy capacitor) 10d and a transistor (hereinafter referred to as a dummy transistor) 20d.

The structure of the dummy capacitor 10d is substantially the same as that of the capacitor 10. The structure of the dummy transistor 20d is substantially the same as that of the cell transistor 20.

The dummy cell DC includes capacitive components due to the dummy capacitor 10d and/or the dummy transistor. The interconnect capacitance Cx of the source line SL is adjusted by the capacitive components of the dummy cell DC.

For example, when the dummy cell DC is connected to the source line SL, the interconnect capacitance Cx increases.

Thus, the semiconductor memory of the modification can improve its characteristics.

(5) Others

A DRAM is exemplified as a semiconductor memory of the present embodiment. If, however, the semiconductor memory is a semiconductor memory (or memory device) in which one memory element stores data of two or more bits, a semiconductor memory other than DRAM may be applied to the semiconductor memory (or memory device) of the present embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
    a first bit line;
    a second bit line;
    a source line;
    a first memory cell electrically connected between the first bit line and the source line and including a first transistor and a first capacitor;
    a second memory cell electrically connected between the second bit line and the source line and including a second transistor and a second capacitor;
    a third transistor electrically connected to the source line; and
    a sense amplifier circuit including:
        a first node electrically connected to the first bit line and a second node electrically connected to the second bit line;
        a first sense unit including a first input terminal electrically connected to the first node via a first transfer gate and a second input terminal electrically connected to the second node via a second transfer gate;
        a second sense unit including a third input terminal electrically connected to the first node and a fourth input terminal electrically connected to the second node;
        a first capacitor including a first terminal electrically connected to the first input terminal of the first sense unit and a second terminal electrically connected to the fourth input terminal of the second sense unit; and
        a second capacitor including a third terminal electrically connected to the second input terminal of the first sense unit and a fourth terminal electrically connected to the third input terminal of the second sense unit.

2. The semiconductor memory according to claim 1, wherein:
    a read operation for the first memory cell includes reading of data from the first memory cell and writing of data to the first memory cell after the reading of data; and
    a write voltage for the writing of data is applied to the source line.

3. The semiconductor memory according to claim 2, wherein the source line is electrically connected to the second bit line during the writing of data to the first memory cell.

4. The semiconductor memory according to claim 1, further comprising:
a fourth transistor including a fifth terminal electrically connected to the first bit line and a sixth terminal electrically connected to the source line; and
a fifth transistor including a seventh terminal electrically connected to the second bit line and an eighth terminal electrically connected to the source line.

5. The semiconductor memory according to claim 4, wherein:
the fifth terminal is electrically connected to the first input terminal of the first sense unit via the first bit line; and
the seventh terminal is electrically connected to the second input terminal of the first sense unit via the second bit line.

6. The semiconductor memory according to claim 4, wherein:
a read operation for the first memory cell includes reading of data from the first memory cell and writing of data to the first memory cell after the reading of data;
the fifth transistor is set in an on state when the reading of data and the writing of data; and
a write voltage for the writing of data is applied to the source line via the fifth transistor having the on state.

7. The semiconductor memory according to claim 1, wherein if a first capacitance of one of the first and second input terminals of the first sense unit, a second capacitance of one of the third and fourth input terminals of the second sense unit and a third capacitance of the source line are represented as "CA," "CB" and "Cx," respectively, there is a following relationship among the first capacitance, the second capacitance and the third capacitance:

$$CB=(Cx \times CA)/(2\times(Cx+CA)).$$

8. The semiconductor memory according to claim 1, further comprising:
a sixth transistor including a ninth terminal electrically connected to the source line and a tenth terminal electrically connected to a first interconnect.

9. The semiconductor memory according to claim 1, wherein the first memory cell stores data of two or more bits.

10. A semiconductor memory comprising:
a first bit line provided above a semiconductor substrate in a first direction perpendicular to a first surface of the semiconductor substrate;
a second bit line provided above the first bit line in the first direction;
a source line provided between the first bit line and the second bit line;
a first memory cell including a first transistor provided between the first bit line and the source line and a first capacitor provided between the first transistor and the source line;
a second memory cell including a second transistor provided between the second bit line and the source line and a second capacitor provided between the second transistor and the source line;
a first word line provided between the first bit line and the source line and connected to a gate of the first transistor;
a second word line provided between the second bit line and the source line and connected to a gate of the second transistor;
a sense amplifier circuit provided on the semiconductor substrate; and
a third transistor provided between the semiconductor substrate and the source line,
wherein the sense amplifier circuit includes:
a first node electrically connected to the first bit line and a second node electrically connected to the second bit line,
a first sense unit including a first input terminal electrically connected to the first node via a first transfer gate and a second input terminal electrically connected to the second node via a second transfer gate;
a second sense unit including a third input terminal electrically connected to the first node and a fourth input terminal electrically connected to the second node;
a first capacitor including a first terminal electrically connected to the first input terminal of the first sense unit and a second terminal electrically connected to the fourth input terminal of the second sense unit; and
a second capacitor including a third terminal electrically connected to the second input terminal of the first sense unit and a fourth terminal electrically connected to the third input terminal of the second sense unit.

11. The semiconductor memory according to claim 10, further comprising a first plug provided between the third transistor and the semiconductor substrate.

12. The semiconductor memory according to claim 10, further comprising:
a fourth transistor provided between the first bit line and the source line; and
a fifth transistor provided between the second bit line and the source line.

13. The semiconductor memory according to claim 10, further comprising:
an interconnect provided above the semiconductor substrate in the first direction; and
a sixth transistor provided between the interconnect and the source line.

14. The semiconductor memory according to claim 10, wherein
the first and second bit lines and the source line extend to a second direction parallel to the first surface of the semiconductor substrate, and
the first and second word lines extend to a third direction parallel to the first surface of the semiconductor substrate and intersecting the first and second direction.

15. The semiconductor memory according to claim 10, wherein if a first capacitance of one of the first and second input terminals of the first sense unit, a second capacitance of one of the third and fourth input terminals of the second sense unit and a third capacitance of the source line are represented as "CA," "CB" and "Cx," respectively, there is a following relationship among the first capacitance, the second capacitance and the third capacitance:

$$CB=(Cx \times CA)/(2\times(Cx+CA)).$$

16. The semiconductor memory according to claim 10, wherein the first memory cell stores data of two or more bits.

* * * * *